(12) United States Patent
Pichumani et al.

(10) Patent No.: US 11,604,212 B1
(45) Date of Patent: Mar. 14, 2023

(54) MULTI-ANGLE SAMPLE HOLDER WITH INTEGRATED MICROMANIPULATOR

(71) Applicant: Meta Platforms, Inc., Menlo Park, CA (US)

(72) Inventors: Pradip Sairam Pichumani, Bellevue, WA (US); Sandeep Rekhi, San Jose, CA (US); Howard Lee Davidson, San Mateo, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 9 days.

(21) Appl. No.: 17/337,008

(22) Filed: Jun. 2, 2021

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/28* | (2006.01) | |
| *G01R 1/07* | (2006.01) | |

(52) U.S. Cl.
CPC ......... *G01R 1/06705* (2013.01); *G01R 1/071* (2013.01); *G01R 1/07392* (2013.01); *G01R 31/2808* (2013.01); *G01R 31/2817* (2013.01)

(58) Field of Classification Search
CPC .......... G01R 1/04; G01R 1/067; G01R 1/073; G01R 31/28; G01R 31/2808; G01R 31/2817
See application file for complete search history.

(56) References Cited

U.S. PATENT DOCUMENTS

| | | |
|---|---|---|
| 6,980,710 B2 | 12/2005 | Farahi et al. |
| 7,465,945 B2 | 12/2008 | Tokuda et al. |
| 8,536,526 B2 | 9/2013 | Bell et al. |
| 10,539,589 B2 | 1/2020 | Ukraintsev et al. |
| 2004/0129897 A1* | 7/2004 | Adachi ................. G01N 1/286 250/311 |
| 2008/0186036 A1 | 8/2008 | Shumaker |

FOREIGN PATENT DOCUMENTS

JP 2010128360 * 6/2010 ............. G02B 21/32

OTHER PUBLICATIONS

"Piezo-Based Robots for Sample Manipulation in Optical and Electron Microscopy", URL: https://www.azonano.com/article.aspx?ArticleID=3875, AZoNano, Aug. 18, 2014, pp. 1-9.
"NANO Robotics Solution for Electron Microscopes", URL: https://imina.ch/storage/app/media/Brochures/IminaTechnologies_Brochure-NANO_LR.pdf, Imina Technologies, as accessed on Apr. 30, 2021, 11 pages.
"Manipulators", URL: https://www.createc.de/index.php?index=1&menuid=29&lng=de&id=61, as accessed on Jan. 15, 2021, pp. 1-3.

* cited by examiner

*Primary Examiner* — Neel D Shah
(74) *Attorney, Agent, or Firm* — Greenberg Traurig, LLP

(57) ABSTRACT

The disclosed apparatus may include support portions, a frame (such as a base) configured to maintain the support portions in a spaced-apart configuration, a sample holder configured to receive a sample, and a probe assembly including micromanipulators configured to position one or more probes in contact with the sample. The sample holder may rotate between the support portions, and the probe assembly may rotate with the sample holder so that the one or more probes may maintain contact with a sample in the sample holder as the sample holder is rotated, for example, to expose a portion of the sample for processing. Various other methods, systems, and computer-readable media are also disclosed.

20 Claims, 12 Drawing Sheets

MULTI-ANGLE SAMPLE HOLDER WITH INTEGRATED MICROMANIPULATOR

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1A:
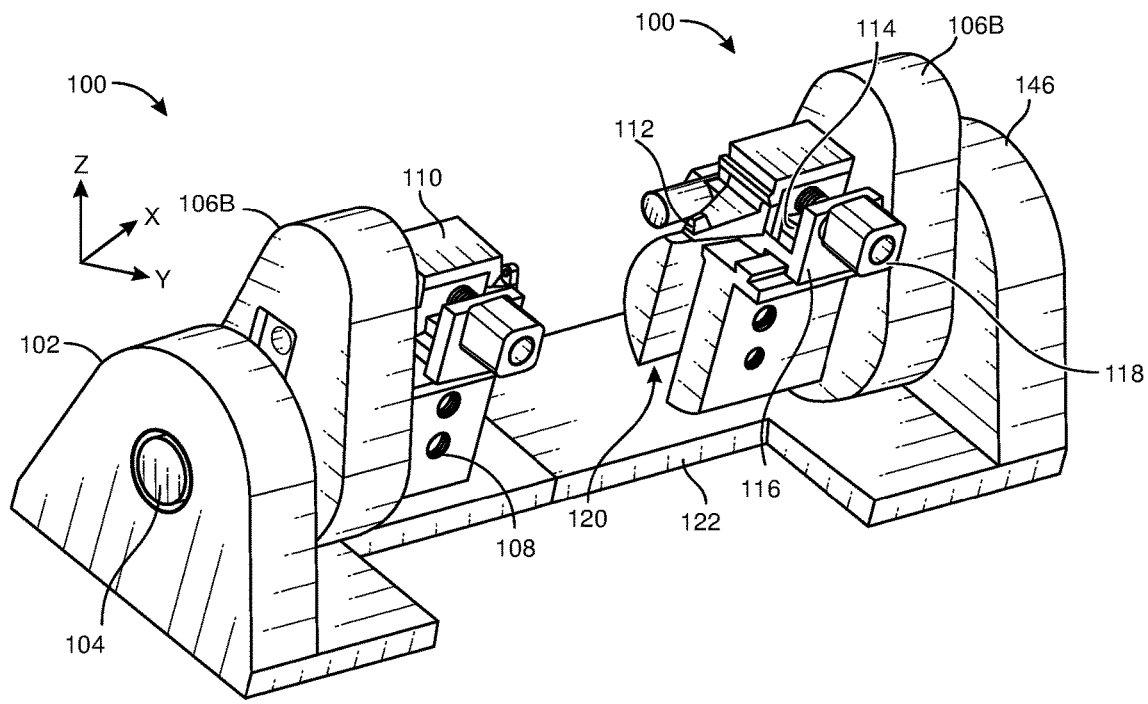
FIGS. 1A-1D illustrate an apparatus according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and are described in detail herein. However, the exemplary embodiments described herein are not intended to be limited to the particular forms disclosed. Rather, the present disclosure includes all modifications, equivalents, and alternatives falling within the scope of the appended claims.

DETAILED DESCRIPTION OF EXEMPLARY EMBODIMENTS

The present disclosure is generally directed to an apparatus configured to receive a sample within a sample holder. As is explained in greater detail below, embodiments of the present disclosure may include an apparatus in which one or more probes may remain in contact with the sample as the sample holder is rotated.

In some examples, an apparatus may include a sample holder configured to receive a sample and a probe assembly including micromanipulators configured to position one or more probes in contact with the sample. The sample holder may rotate between support portions, and the probe assembly may rotate with the sample holder so that the one or more probes remain contact with a sample in the sample holder.

Example apparatus and methods allow in-situ characterization and/or fault isolation within a sample during application of a process to the sample. The process may be an additive process (e.g., deposition) or a subtractive process (e.g., ablation), and may include determination of one or more electrical and/or optical parameters before, during, and/or after the process. Example apparatus may be used with an instrument (such as an analytical instrument, processing instrument, or other apparatus), for example, by being placed within a chamber of the instrument. Example apparatus may also be combined with the configurations of one or more conventional instruments to form a novel instrument providing one or more functions of the apparatus along with additional processing and/or analytical capabilities. In some examples, an apparatus may allow the sample to be rotated in-situ while one or more probes remain in contact with the sample.

Features from any of the embodiments described herein may be used in combination with one another in accordance with the general principles described herein. These and other embodiments, features, and advantages are more fully understood upon reading the following detailed description in conjunction with the accompanying drawings and claims.

Figure 1B:
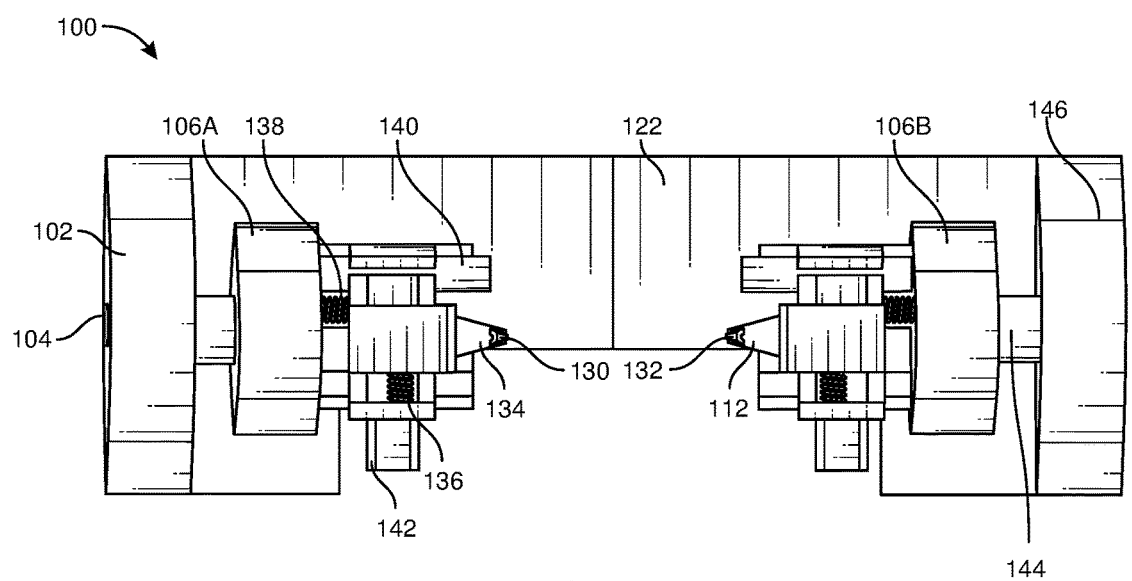
Figure 1C:
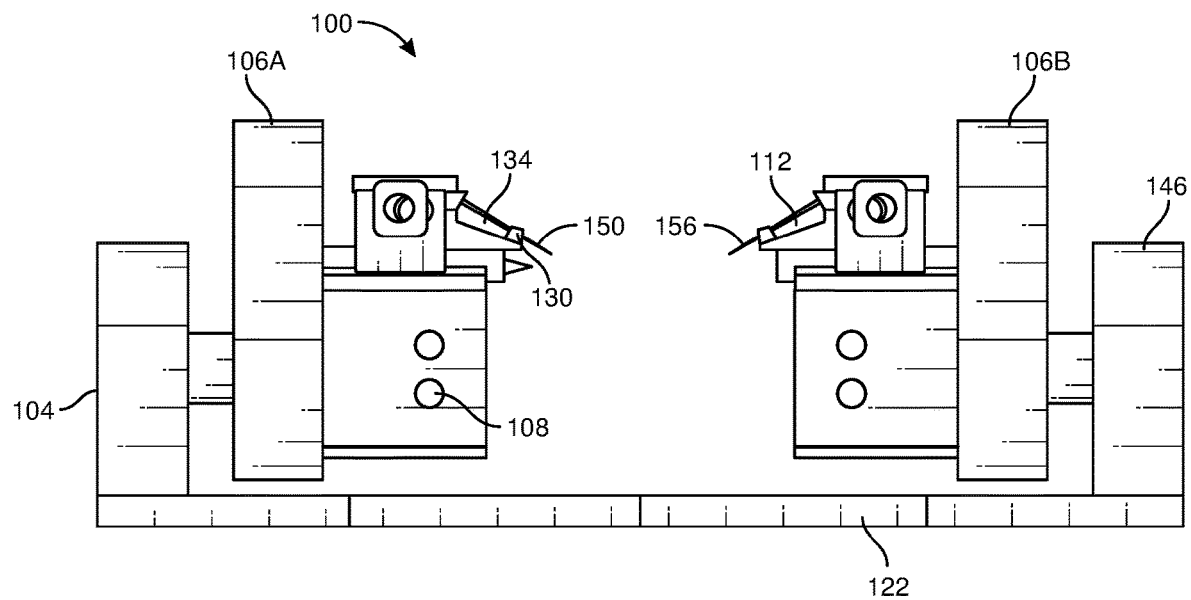
Figure 1D:
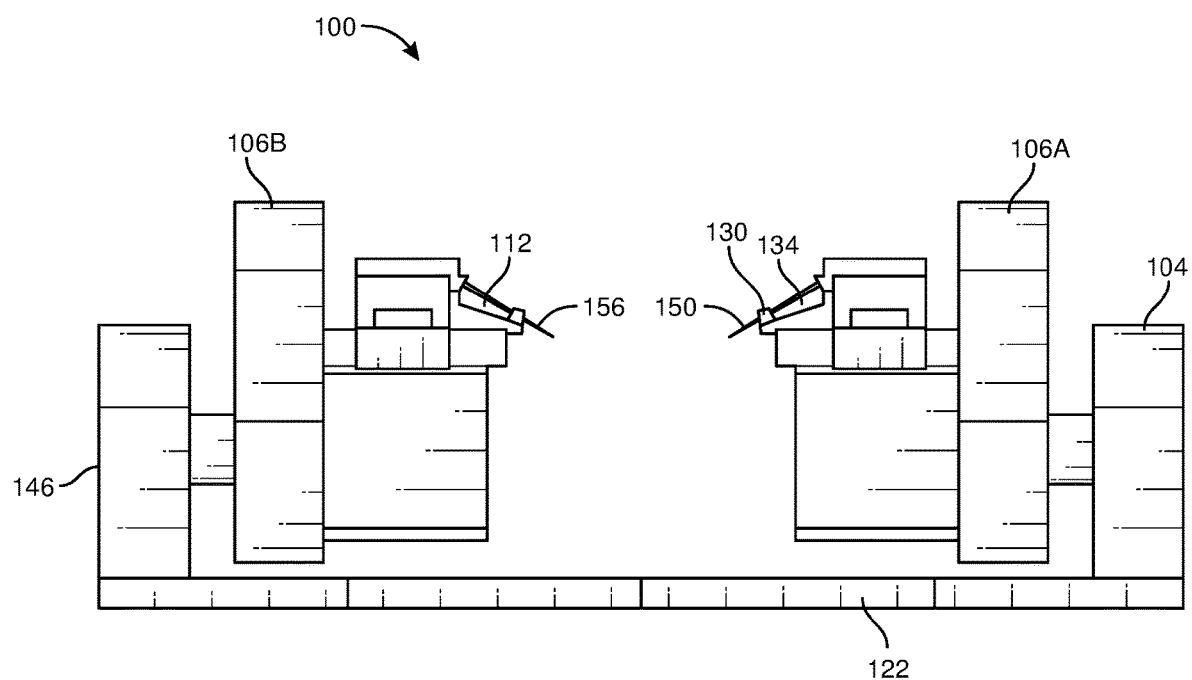
Figure 2A:
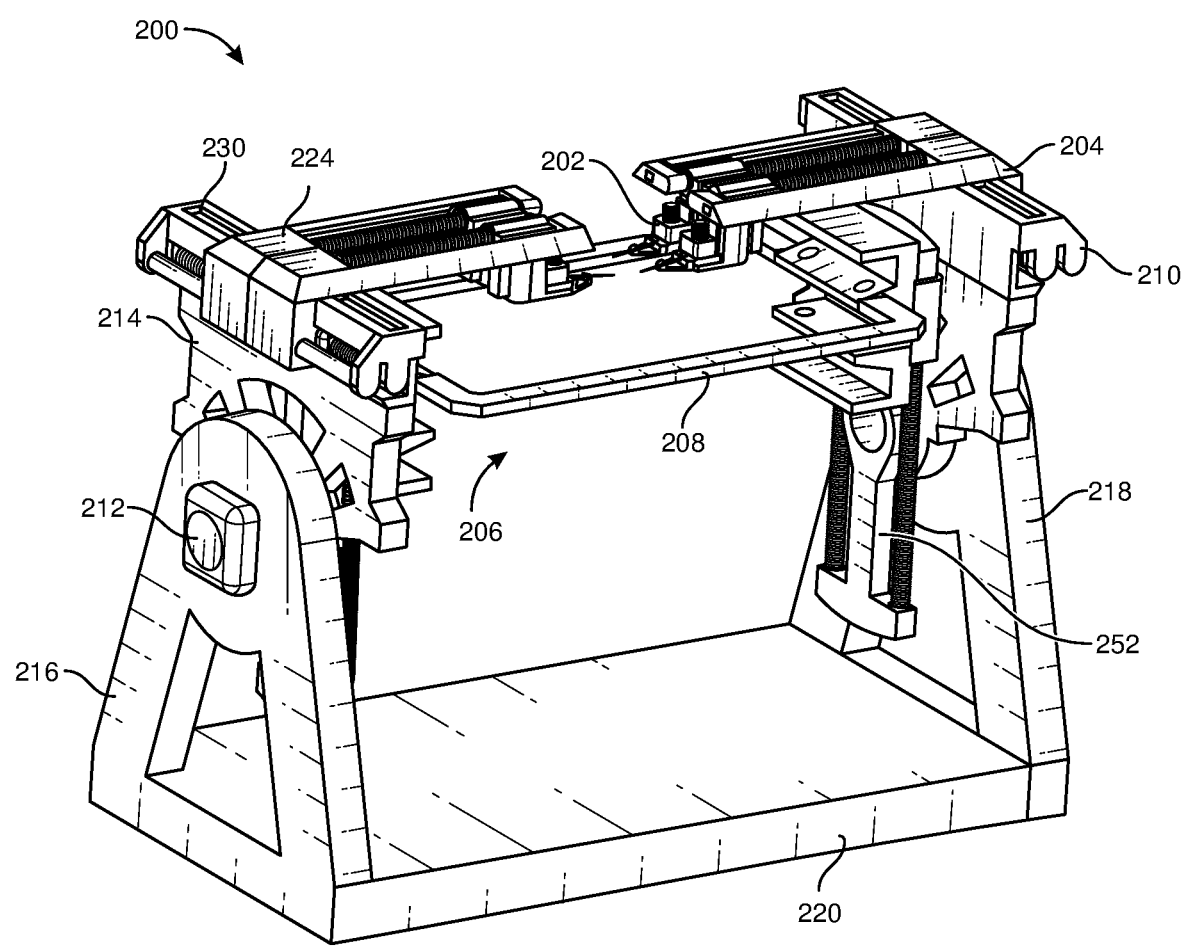
FIGS. 2A-2D illustrate a further apparatus according to some embodiments.
Figure 2B:
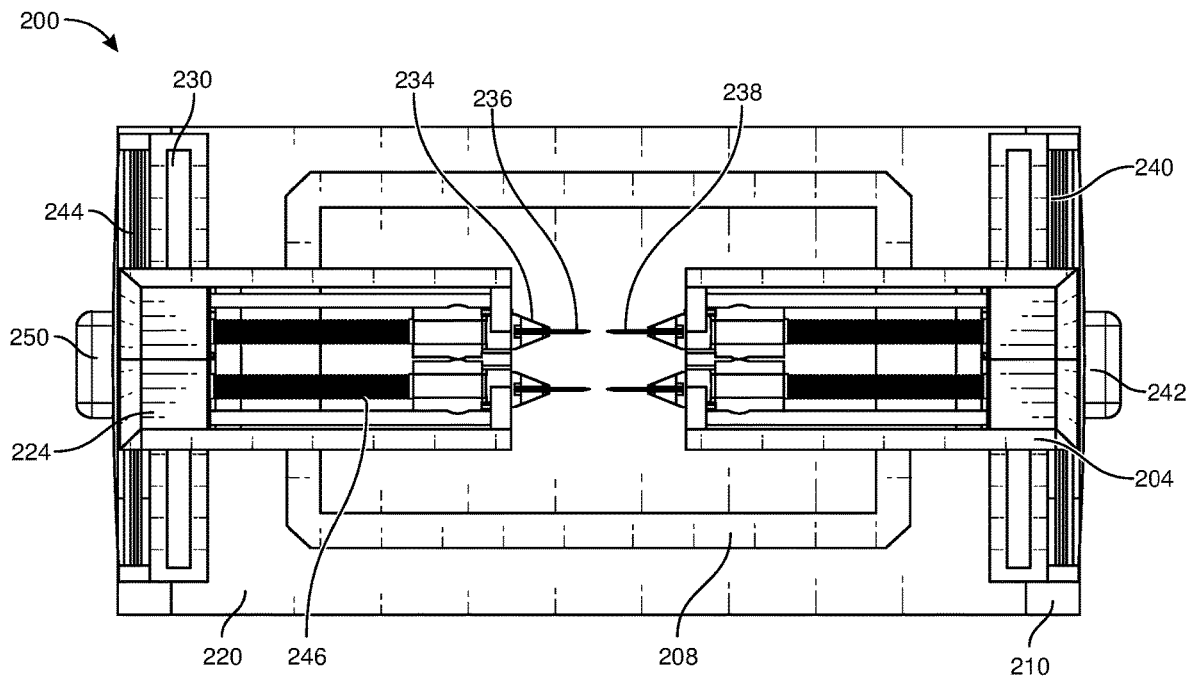
Figure 2C:
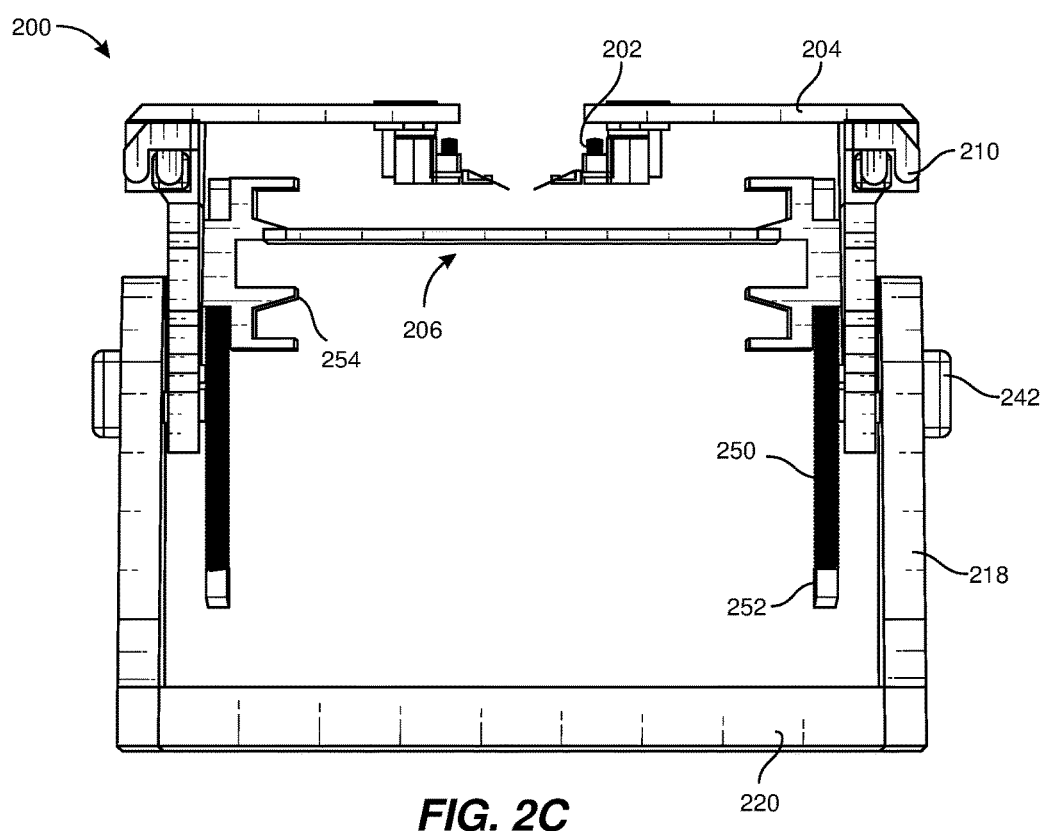
Figure 2D:
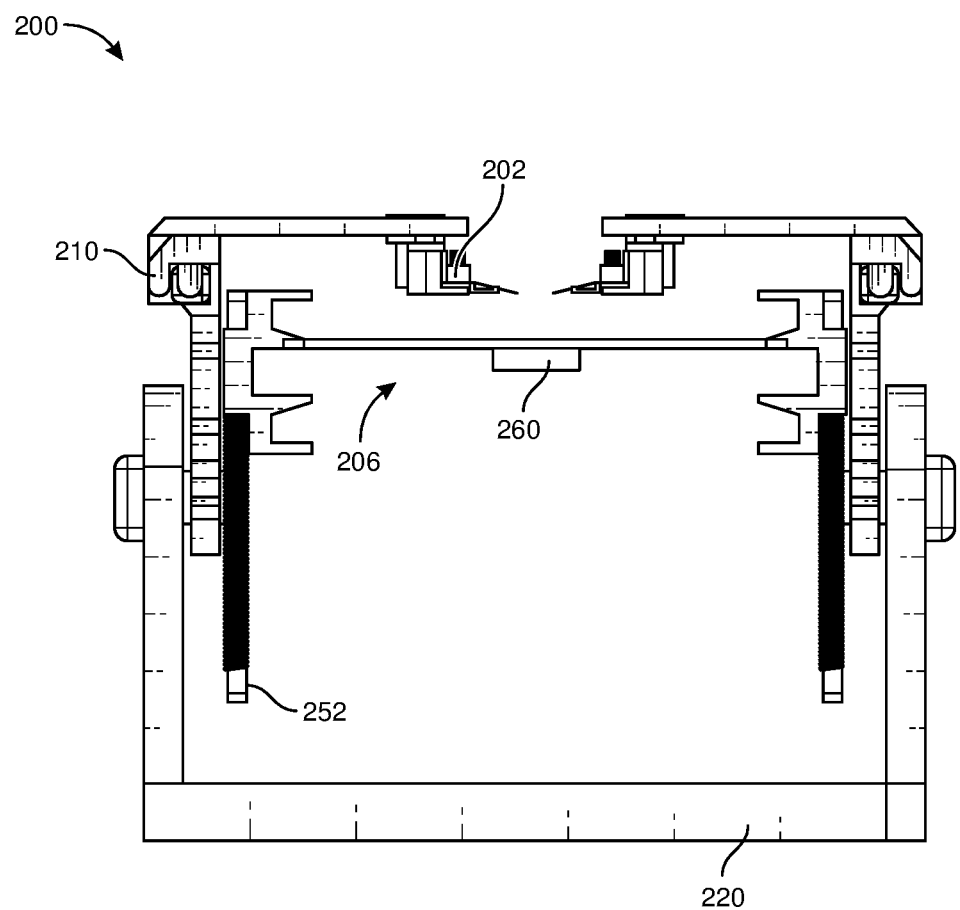
Figure 3:
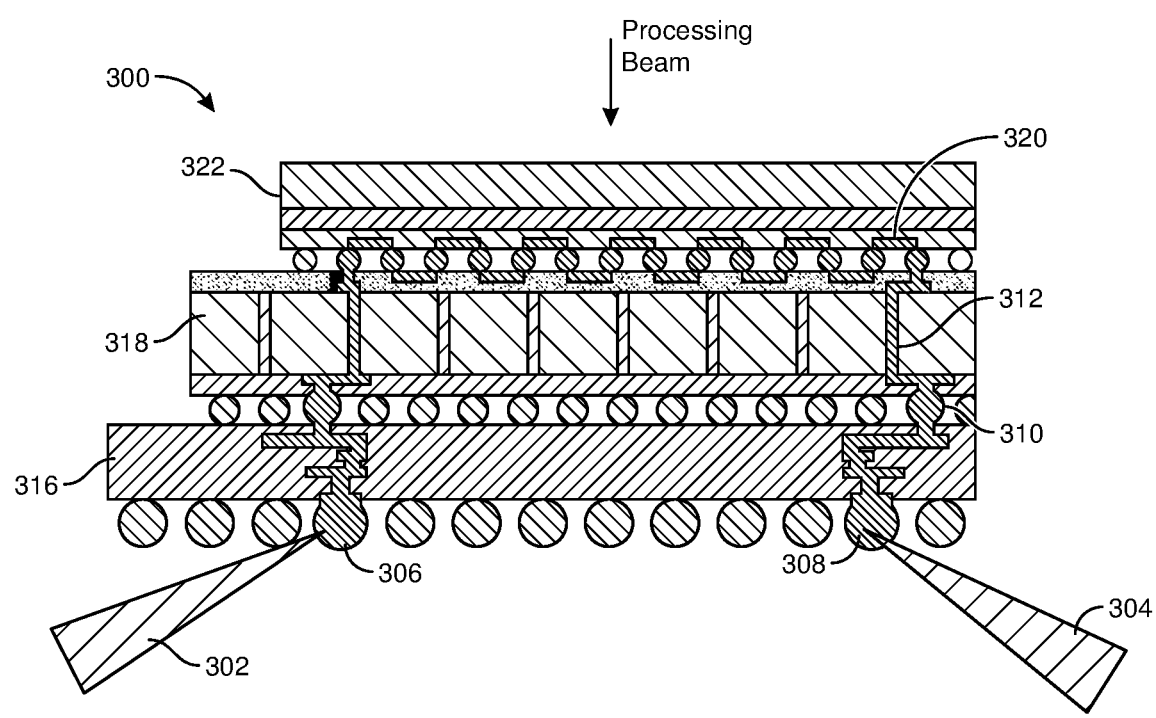
FIG. 3 illustrates use of electrical probes.
Figure 4:
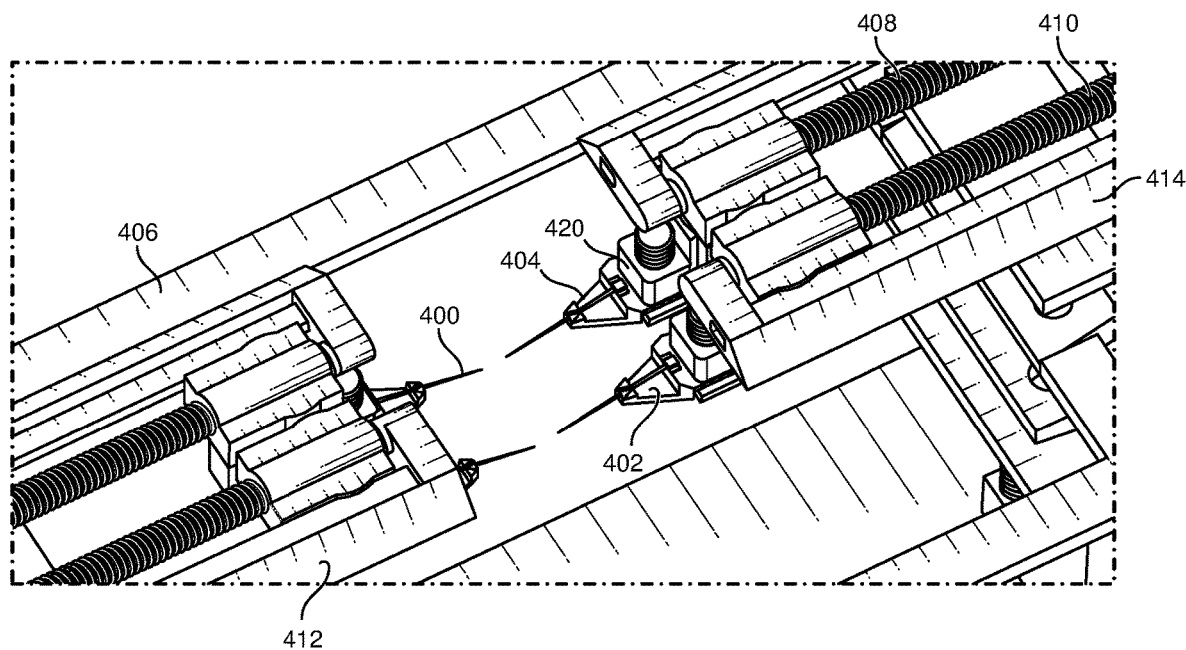
FIG. 4 illustrates an example arrangement of probes within a probe assembly.
Figure 5:
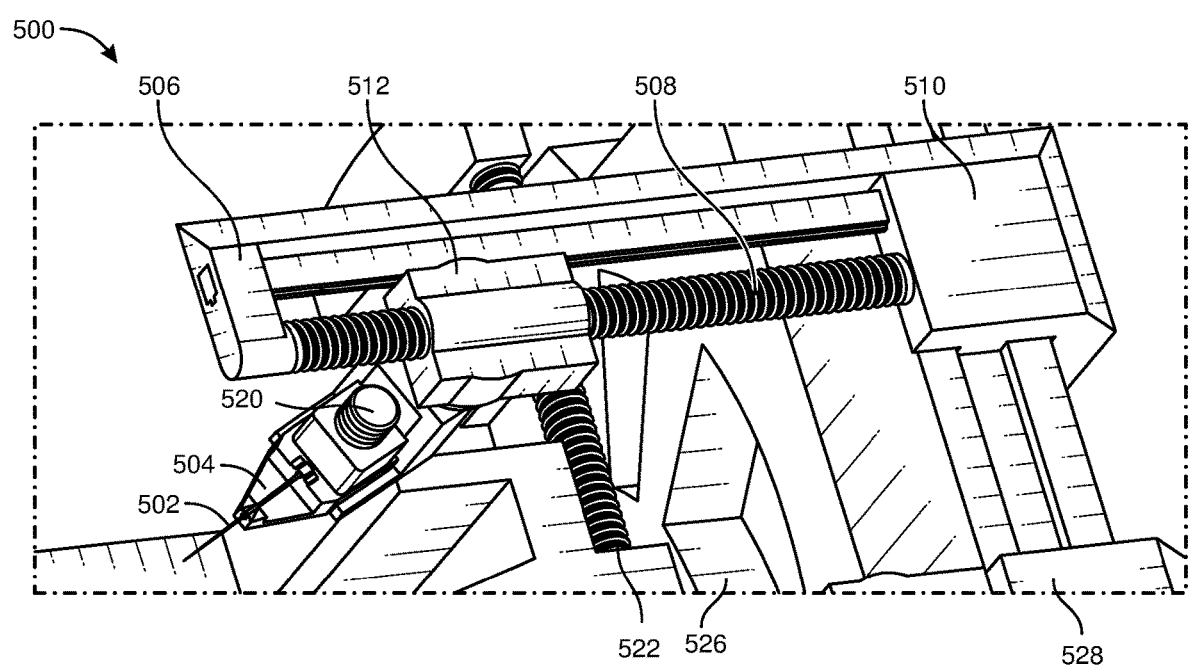
FIG. 5 illustrates control of a probe orientation and position using a micromanipulator.
Figure 6:
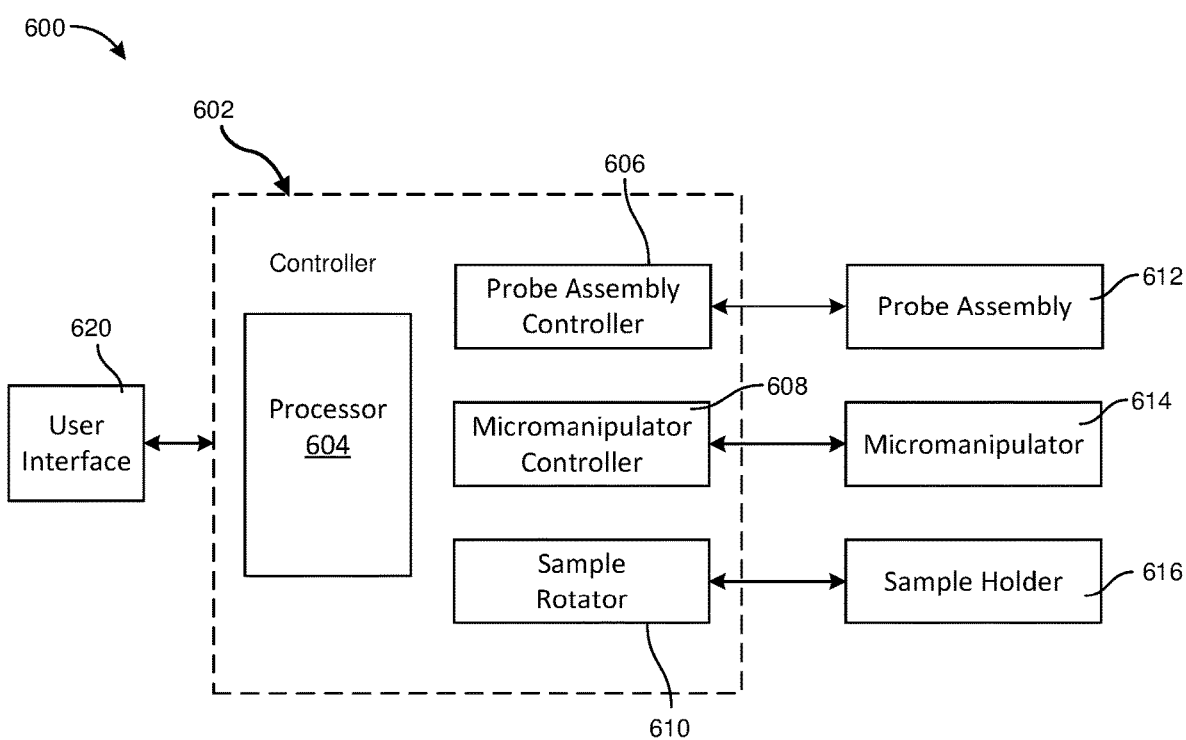
FIG. 6 illustrates an example system including a controller.
Figure 7:
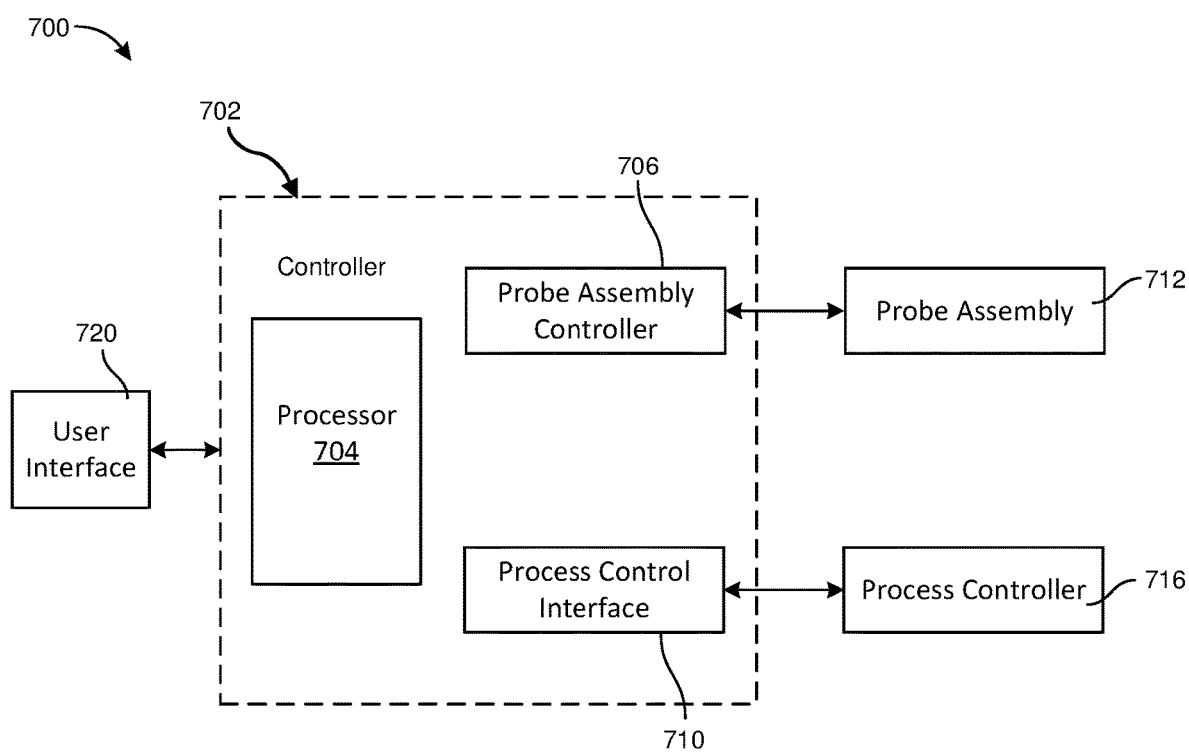
FIG. 7 shows an example system for applying a process to a sample while determining a probe parameter.
Figure 8:
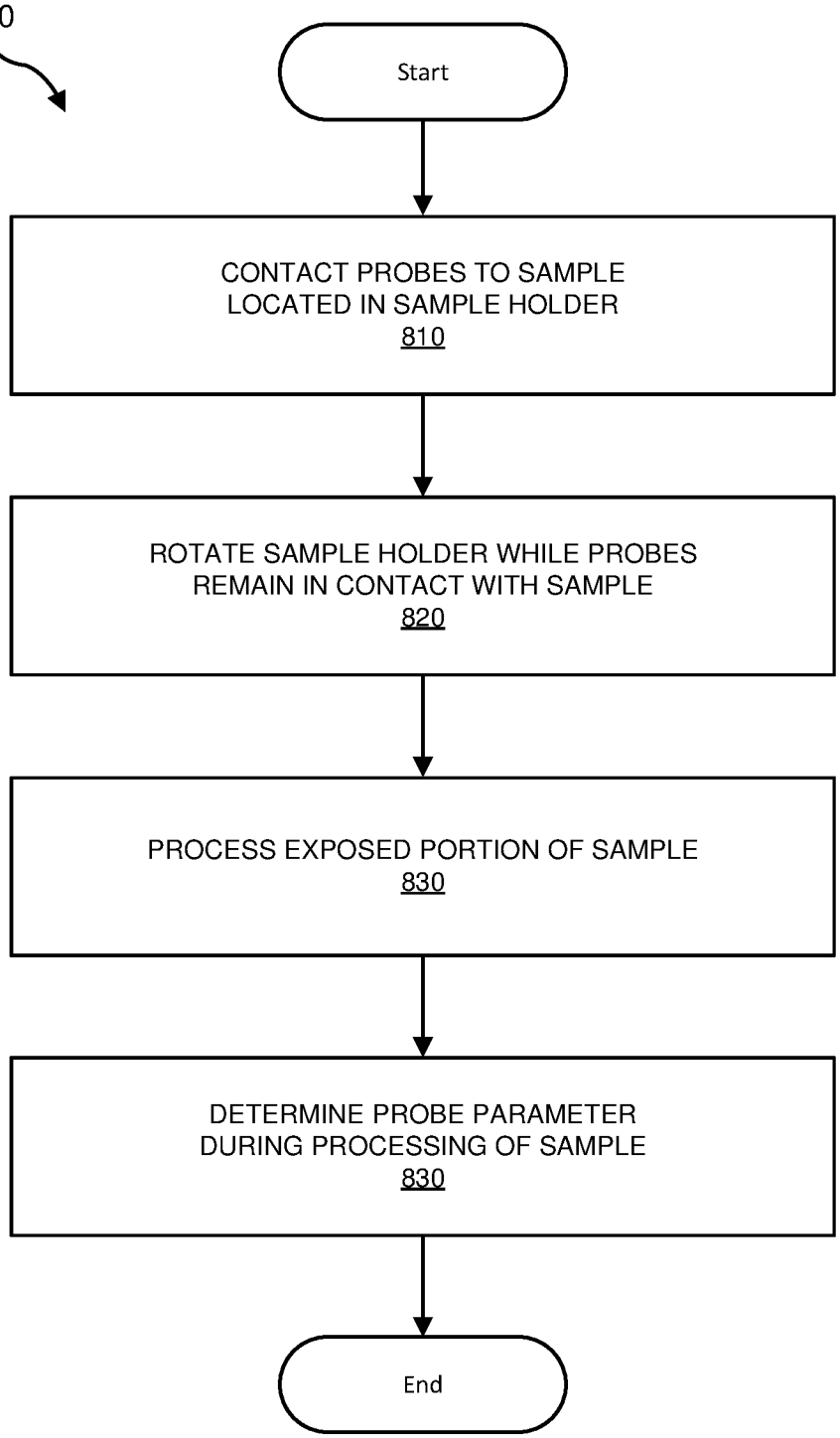
FIGS. 8 and 9 illustrate example methods according to some embodiments.
Figure 9:
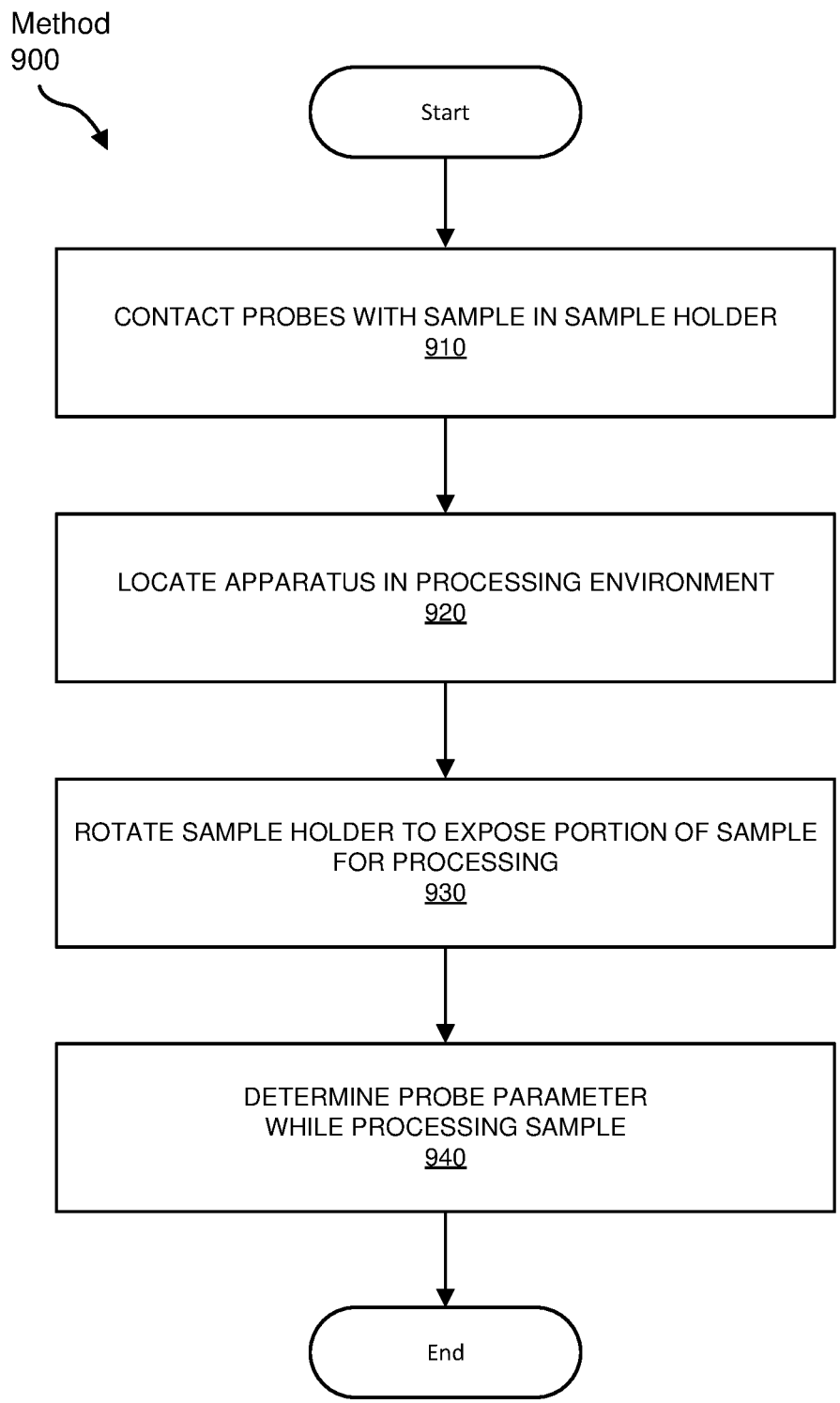

The following provides, with reference to FIGS. 1-9, detailed descriptions of apparatus, systems, and methods according to various examples. FIGS. 1A-1D illustrate an example apparatus having a sample holder that may be rotated while one or more probes are in contact with the sample. FIGS. 2A-2D illustrate a further apparatus according to some embodiments. FIG. 3 illustrates example electrical probes, and FIG. 4 illustrates an example arrangement of probes within a probe assembly. FIG. 5 further illustrates control of a probe orientation and position using a micromanipulator. FIGS. 6 and 7 illustrates example systems for determining a probe parameter while, for example, applying a process to a sample. FIGS. 8 and 9 illustrate example methods according to some embodiments.

FIGS. 1A-1D illustrate an apparatus according to some embodiments.

FIG. 1A shows apparatus 100 including first support portion 102, rotatable connector 104, sample holder including sample holder first part 106A and sample holder second part 106B, sample attachment 108, z-axis micromanipulator 110, probe holder 112, x-axis micromanipulator 114, x-axis micromanipulator 116, motor 118 (e.g., to drive a micromanipulator), sample receiving gap 120, frame 122 (in this example, a base), and second support portion 146.

In this example, the sample holder includes a first part 106A rotatably connected to first support portion 102, and second part 106B rotatably connected to second support portion 146. In some examples, the sample may mechanically interconnect the first and second parts 106A and 106B, respectively, when the sample is received by the sample holder. For example, the sample may include a rigid board (e.g., a circuit board) or other sample component that may provide the mechanical interconnection.

FIG. 1B shows a top view of apparatus 100, showing elements discussed above in relation to FIG. 1A. The figure shows actuator drives 136 and 138, along with motor 142, and further illustrates the relative arrangements of first support portion 102 connected by rotatable connector 104 to first part 106A of the sample holder, and second support portion 146 connected by second rotatable connector 144 to second part 106B of the sample holder. Probe holders 134 and 112 (also shown in FIG. 1A) may include probe receiving tips 130 and 132 respectively. The probe holders 134 and 112 are connected to the respective sample holder portion by an arrangement of microactuators, which may direct one or more probes to contact a sample when the sample is received by the sample holder.

FIG. 1C shows a front view of the apparatus, further illustrating elements discussed above in relation to FIGS. 1A and 1B. The figure shows probe holders 134 and 112 receiving probes 150 and 156 respectively. As discussed further below, a probe may include a wire, an optical fiber, a needle (e.g., as used for scanning tunneling microscopy), or other form of contact or interaction with the sample.

FIG. 1D shows a rear view of the apparatus 100, which generally similar to FIG. 1C. Element numbers are discussed above in relation to FIGS. 1A-1C.

FIGS. 2A-2D illustrate a further apparatus according to some embodiments.

FIG. 2A shows apparatus 200 including micromanipulator assembly 202 (associated with a probe holder and discussed in more detail below), probe assembly 204, sample holder 206 (including sample holder plate 208), actuator assembly 210, rotatable connector 212 (which may include a motor), first support portion 216, and second support portion 218, sample holder tilt adjuster 214, and frame 220 (in this example, a base), and guide slot 230. Probes are discussed in more detail below.

In this example, the sample holder 206 may include a sample holder plate 208 (configured to receive a sample) that helps form a mechanical coupling between parts of the sample holder 206 having rotatable connections to the first support portion 216 and second support portion 218. The sample holder 206 may include sample holder plate 208 and additional components (discussed further below) to configured to allow reorientation of the sample holder relative the support portions. The sample holder plate 208 may be configured to support samples that may include circuit boards, wafers, semiconductor devices, and the like. The sample holder 206 may be rotatable between the first and second support portions, for example, using rotatable connector 212 between the sample holder 206 and first support portion 216. There may also be rotatable connector between sample holder 206 and second support portion 218. One or both rotatable connectors may include a motor, which may be controlled by an external controller (not shown), for example, to rotate the sample holder to a predetermined angle (e.g., relative to a starting position or other reference position). In some examples, sample holder plate 208 may include an electrically resistive element (or may be formed from an electrically resistive material) allowing electrical heating of the sample.

In some examples, the sample holder (e.g., the sample holder plate 208) may include a sample heater configured to adjust the temperature of the sample when the sample is received by the sample holder. The sample heater may be an electrical heater (e.g., a resistive heater or an IR (infrared) heater), and may be controlled by heater control signals from a controller. For example, a sample holder plate may include electrically resistive coils (e.g., around the periphery). Electrical connections (e.g., between a controller and one or more probes, or to a sample heater) may be made through a rotatable electrical connection that may include brushes or other rotatable electrical contacts. In some examples, rotation of the sample holder may be limited to a fixed angular range (e.g., +/−180 degrees relative to a reference orientation) which may allow cable connections to one or more rotatable components (e.g., one or more probes, heater connections, other sample connections such as sample device power terminals, or other connection(s)).

Micromanipulator assembly 202 may include z-axis adjustment and rotation for the probe holder. In this example, there may be four independent micromanipulators that may contact desired contact points on the sample when the sample is received by the sample holder. Probes may be in contact with a surface feature of the sample or an exposed feature after sample preparation (e.g., formation of a cross-section of the sample, component or housing removal, and the like).

FIG. 2B shows a top view of apparatus 200, showing elements discussed above in relation to FIG. 2A. The figure illustrates probe assemblies 204 and 224, attached to the sample holder 206 so that the probe assemblies rotate with the sample holder as the sample holder rotates between rotatable connectors 212 and 242. The probe assembly may include probe holders such as probe holder 234 and may include probes such as probes 236 and 238. The probe assembly may include a micromanipulator arrangement that may include one or more actuator drives, such as actuator drive 246, which may be configured to provide a linear translation of one or more probe holder and associate probe(s). Actuator 244 may translate the probe assembly 224 relative to the sample holder 206 and may be driven by actuator assembly 210. Micromanipulator 240 may translate probe assembly 204 relative to the sample holder 206, and may be termed the x-axis micromanipulator. Guide slot 230 formed in the sample holder 206 may further guide translation of the probe assembly 224. The probe assembly 224 may also engage in a slidable relationship with an outer lip of the actuator assembly 210.

In some examples, the micromanipulator may have three degrees of freedom, X as shown, Y at 90° to X, and Z to raise and lower the probe point.

In this context, the sample holder may include one or more components configured to receive the sample, along with one or more components configured to engage with the first and second support portions and to support the probe assembly.

FIG. 2C shows a front view of apparatus 200, including actuator drive 250 configured to adjust the position of the probe assembly 204 relative to the sample holder 206. The translation direction of actuator drive 250 may be generally orthogonal to that of actuator 244, and this relationship may be maintained as the sample holder is rotated. Actuator drive 250 may adjust the distance between the probe assembly 204 and the end of rotating arm 252.

FIG. 2D shows a back view of the apparatus, further illustrating the relationships between the elements discussed above in relation to FIGS. 2A-2C.

FIG. 2D also shows a possible location for an optional sample heater 260, which may be an electrical resistive heater including one or more resistive elements, coils, or other suitable components. Additional sample heaters may be arranged around the sample holder 206, for example, to improve temperature uniformity. For example, sample heaters may be located on opposite sides of the sample holder plate 208, and in some examples may have a symmetrical arrangement around the sample holder. The sample heater 260 is optional and is not shown in the other views of the apparatus (FIGS. 2A-2C). Electrical connectors are not shown for illustrative clarity, but may provide an electrical connections to a power source for the apparatus.

In some examples, the sample holder plate may include a metal frame. In some examples, the sample holder plate may be a solid plate and may not include a central aperture.

FIG. 3 illustrates use of electrical probes, showing first electrical probe 302 and second electrical probe 304 in contact with electrical contacts 306 and 308 of sample 300. The figure is illustrative and exemplary, and the sample configuration is arbitrary. In a correctly fabricated sample, there may be an electrical path between the probes, here shown as similarly shaded conductive elements including electrical contacts 306 and 308, connection through board 316, electrical connector 308, via 312 (e.g., passing through circuit board 318) and traces such as trace 320. The sample has an upper surface layer 322.

The downwards arrow labeled as "Processing Beam" represents, in simplified form, a beam incident on the sample, for example, on upper surface layer 322. In some examples, a probe parameter (e.g., electrical resistance) between the two probes 302 and 304 may be monitored during a time period in which the sample is subject to a process, such as irradiation with the beam. For example, a probe parameter may be measured as material is deposited or removed from the sample. This may aid identification of faults within the device.

In some examples, an apparatus similar to that shown in FIG. 3 may use one or more optical probes. For example, a pair of optical probes (e.g., formed from optical fibers) may contact a sample to form an optical coupling for an optical signal (e.g., a light beam) into and/or out of the sample. An optical signal may pass from one probe into the sample, along an optical path within the sample, and then be received by a second optical probe. An example probe parameter may be based on a ratio of an output optical signal to an input optical signal. For example, the intensity of light detected by the second probe may be used to determine an optical transmissivity of an optical path through the sample. In some examples, a sample may be sliced (e.g., cross-sectioned) along any desired plane to expose desired electrical or optical contact locations.

In some examples, a beam may include a particle beam (e.g., an ion beam, electron beam, atomic beam, neutron beam or other particle beam), an electromagnetic beam (e.g., a laser beam (of any suitable wavelength), ultraviolet (UV) beam, IR beam, or visible beam), an ultrasound beam (e.g., in the frequency range 50 kHz-100 MHz).

FIG. 4 illustrates an example arrangement of probes within a probe assembly. The figure represents a portion of an apparatus. For example, this arrangement of probes may be used in the example apparatus described above in relation to FIGS. 2A-2D. The figure shows probes (e.g., probe 400) supported by probe holders (e.g., probe holders 402 and 404) within first and second probe assemblies 412 and 414 respectively. The positions and orientations of the probes may be individually controlled, for example, using micromanipulator assemblies associated with each probe holder, such as micromanipulator assembly 420. Actuator drives (such as actuator drives 408 and 410) may provide translation probe holders 402 and 404 and associated probes. Micromanipulator assembly 420 may provide additional axes of translation and/or rotation of the probe holder 404 and associated probe.

FIG. 5 illustrate further details of an example apparatus portion 500 including a micromanipulator assembly configured to adjust orientation and translation (along 3 axes) of a probe holder. The figure represents a portion of an apparatus, such as an apparatus similar to the example apparatus described above in relation to FIGS. 2A-2D. The apparatus portion includes a probe holder 504 holding a probe 502. A first micromanipulator includes an actuator including first end portion 506, actuator drive 508, second end portion 510 (e.g., including a motor), and probe holder attachment 512. The probe holder attachment may be translated along the direction of the actuator drive 508, for example, using a motor (not shown) in second end portion 510. The probe holder 504 and probe 502 move with the probe holder attachment 512. Actuator drive 522 provides translation of the probe holder along an orthogonal direction to that of actuator drive 508. Three axis translation control of the probe holder 504 may be provided using a third actuator along an orthogonal direction, which may be provided by actuator drive 520 or a configuration similar to that shown in FIGS. 2A-2D (e.g., based on rotating arm 252 discussed above). In some examples, actuator drive 520 may be used to rotate the probe holder, for example, through at least 180 degrees, in addition or as an alternative to any translation control. Other components shown include second probe assembly 528 (not shown in detail), which may be similar to probe assemblies discussed above, and sample holder tilt adjuster 526 that may be similar to sample holder tilt adjuster 214 discussed above. The example apparatus portion 500 may be similar to a portion of apparatus 200 discussed above in relation to FIGS. 2A-2D, though illustrated examples may be combined in any suitable manner.

FIG. 6 illustrates an example system 600 including a controller 602. The controller 602 includes processor 604, probe assembly controller 606, micromanipulator controller 608, sample rotator 610, and any further components helpful to operation, such as one or more memory modules, clock, and the like. The controller may be in communication with a probe assembly 612, micromanipulator 614 (which may represent an assembly of one or more micromanipulators), sample holder 616, and user interface 620. In some examples, one or more of the probe assembly controller 606, micromanipulator controller 608, or sample rotator 610 may be provided by software executable by the process, and/or any suitable additional circuit components.

The probe assembly controller 606 may receive one or more probe signals from the probe assembly 612 and may determine a probe parameter from a particular probe signal. The probe assembly controller may also provide a voltage to the probe assembly, for example, between two or more probes. For example, a voltage may be applied between a pair of probes and a probe signal, such as current flow though the probes, may be determined. The probe assembly controller may then be configured to determine the resistance (or, more generally, the impedance) between the pair of probes. In some example, impedance may be determined as a function of frequency of an applied voltage to give an impedance spectrum.

The micromanipulator controller 608 may be in communication with micromanipulator 614, and may be used to adjust the position of the probes and to locate one or more probes at particular probe locations on the sample. This may be achieved under automatic and/or user control.

The sample rotator 610 may be in communication with the sample holder 616 or an associated component. For example, the sample rotator may control rotation of the sample holder through control of a motor (e.g., a stepper motor) associated with a rotatable connection between the sample holder and a support portion.

The controller may further communicate with a user interface 620, and may receive user commands (e.g., through a keyboard, mouse, and/or graphical user interface) and/or may provide a visual representation of a probe parameter (e.g., using an electronic display). The controller 602 may further include a temperature controller in communication with a heater associated with the sample holder.

FIG. 7 further illustrates an example system 700 including a controller 702, which may include additional functionality, such as the functionality of the system 600. Controller 702 includes processor 704, probe assembly controller 706, and process control interface 710. The probe assembly controller 706 may receive one or more probe signals from the probe assembly 712 and may determine a probe parameter from a particular probe signal, similar to the discussion above in relation to FIG. 6. Process control interface 716 may communicate with a process controller (e.g., a controller of a separate instrument) or any process control mechanism (e.g., to activate a beam source). Process control interface 716 may activate and/or deactivate a process, such as deposition process or a material removal process such as ablation. For example, process control interface 716 may turn a beam on or off (e.g., a particle beam or an electromagnetic radiation beam). Process controller interface 716 may control the generation of a processing environment, for example, by evacuating a chamber in which the sample holder is located. The user interface 720 may be used provide a user-requested process command (e.g., process start, stop, or process parameter adjustment), and/or display probe parameter values (e.g., to display probe parameter changes during a process).

FIG. 8 illustrates an example method according to some embodiments. The example method 800 may include contacting probes to a sample (810), rotating a sample holder while the probes remain in contact with the sample (820) as the sample holder is rotated, processing an exposed portion of the sample (830), and determining a probe parameter during the processing of the portion of the sample (840). In some examples, the probe parameter may be based on an electrical impedance or an optical transmissivity between a pair probes (of the probes in contact with the sample). In some examples, the pair of probes may be a pair of electrical probes, and the probe parameter may be based on an electrical impedance between the pair of electrical probes. In some examples, the pair of probes is a pair of optical probes; and the probe parameter may be based on an optical transmissivity between the pair of optical probes. Example processes may include exposing the portion of the sample to a particle beam (e.g., an ion, atom, electron, or other subatomic particle beam), or an electromagnetic beam (e.g., laser radiation). In some examples, the process may remove material from the sample (e.g., by ablation). In some examples, the process may add materials to the sample (e.g., by a deposition process). In some examples, the process may modify the sample (e.g., by heating, photochemical effects, electromagnetic effects, and the like). In some examples, the process may include exposing the portion of the sample to a particle beam or an electromagnetic beam.

FIG. 9 illustrates a further example method according to some embodiments. The example method 900 may include: contacting probes with a sample in the sample holder of an example apparatus (910) where the probes may be in contact with the sample at one or more probe contact points; (optionally) locating the apparatus in a processing environment (920); rotating the sample holder to expose a portion of the sample for processing (930), where the probes remain in contact with the contact points on the sample as the sample holder is rotated; and determining the probe parameter while processing at least a part of the exposed portion of the sample (940). In some examples, locating the apparatus in the processing environment may include locating the apparatus within a chamber of an instrument, such as an analytical or processing instrument. In some examples, locating the apparatus in the processing environment may include modifying a local environment of a sample, and may include evacuating a chamber, surrounding the sample with an inert gas, or otherwise providing a suitable processing environment. In some examples, processing at least a part of the exposed portion of the sample may include directing a beam (e.g., a particle beam or an electromagnetic beam) towards at least a part of the exposed portion of the sample.

In some examples, methods described herein may be implemented as computer-implemented methods, for example, performed by a controller. In some examples, a controller may include at least one physical processor and physical memory including computer-executable instructions that, when executed by the physical processor, cause the physical processor to implement one or more steps of method such as described herein. In some examples, a non-transitory computer-readable medium including one or more computer-executable instructions that, when executed by at least one processor of a computing device, cause the computing device to perform one or more steps of a method such as described herein. Example methods may include computer-implemented methods that may be performed by any suitable computer-executable code and/or computing system, including the systems illustrated in FIGS. 6 and 7. In some examples, a method step may represent an algorithm whose structure may include or is represented by multiple sub-steps.

Further Apparatus Configurations

In some examples, the apparatus may be located at least partially within an instrument. In this context, an instrument may be an analytical instrument or an instrument that may allow processing of the sample, for example, by irradiating a portion of the sample with one or more beams (e.g., particle beams and/or electromagnetic beams). In some examples, the sample may be rotated or otherwise moved while the sample remains under at least a partial vacuum, a high vacuum, an inert atmosphere (e.g., an inert gas, nitrogen, or other suitable non-reactive gaseous environment) or other processing condition (e.g., within a chamber of an instrument). Example apparatus may allow a sample to be rotated, otherwise manipulated, and/or processed without removing the sample from the instrument. Example instruments may include an electron-beam based instrument (e.g., a scanning-electron microscope or SEM) or other instrument, such as one or more of the following: ion-beam instruments, electron beam instruments, other particle beam instruments, and electromagnetic radiation instruments such as lasers. In some examples, EBIC (electron beam induced current) and/or EBAC (electron beam absorption current) analysis may be performed while the probes are in contact with a sample.

In some examples, a sample may be modified before being placed in the sample holder. For example, a sample may be cross sectioned to the start of a failing trace with input and output traces exposed. Analysis can be performed on the cross section, or, in some examples, a sample rotation can be adjusted (e.g., relative to an incident beam) so that the beam (e.g., an electron beam) is normal to the top surface (e.g., die front-side or backside).

In some examples, an apparatus may be used to determine one or more probe parameters, which may include one or more electrical parameters and/or one or more optical parameters of a sample.

In some examples, an apparatus may include a frame (e.g., which may include a base), one or more support portions (to which the sample holder may be attached), a rotatable attachment between the support portion and the sample holder (e.g., a pivot, hinge, or other attachment, which may include an integrated motor), a sample holder (e.g., rotatably supported by a support portion or between a pair of support portions) which may include screw holes or other attachments to hold a sample, one or more probes (e.g., electrical probe that may make electrical contact with an electrical conductor of the sample, or an optical probe that may be in optical communication with an optical component of the sample, such as a waveguide), one or more micromanipulators (e.g., which may include one or more probe holders configured to support one or more probes), an optional second rotatable attachment between the sample holder and an optional second support portion (e.g., which may have an integrated motor). In some examples, a sample holder may include an attachment configured to receive the sample, such as at least one of a hole, a clamp, or a screw.

Sample Holder

In some examples, the sample holder may have a unitary assembly and/or may extend between the first and second support portions.

In some examples, a sample holder may be rotated through 180° for top down/cross-sectional inspection with the probes in contact with the sample (e.g., with electrical probes in contact with a trace of interest). In some examples, a sample holder may be freely rotated about any angle along one or more axes of rotation.

Samples

In some examples, a sample may include an electrooptical device, such as an LED (light-emitting diode), laser (e.g., a vertical cavity surface emitting laser (VCSEL)), or other electroluminescent device. For example, light extraction efficiency may be determined for a light-emitting device, such as a laser, and this parameter may be improved (e.g., optimized) using a process applied to the device. In some examples, a sample holder may enable deposition or ablation of layers within the sample, which may enable in-situ electrical and/or optical characterization, in some cases during performance of the process.

In some examples, a sample holder may be configured to adjust the temperature of a sample. The sample holder may be configured to raise and lower the temperature of the sample which may be helpful, for example, during analytical probing. The sample holder may include a resistive heater allowing an increase in temperature of the sample. Temperature may be controlled using temperature control signals from the controller, and may be set to a particular temperature value by an operator or using stored process parameters for a selected process. Passive cooling may be used. In some examples, a sample holder may include a thermoelectric element or a liquid loop with flexible tubing connection that may be in fluid communication with a temperature controller (e.g., that may be located inside or outside of the chamber). In some examples, an apparatus may include a temperature sensor providing a temperature signal to a controller, and the controller may provide a heater signal to an electrical heater. In some examples, a heater may include a thermoelectric element. In some examples, a thermoelectric element may include a thermal path to the instrument base or an exterior location, such as a strip of copper or other metal, or a fluid conduit.

In some examples, an example probe assembly may include one or more micromanipulators. The micromanipulators may enable contact between the probe assembly and the sample. For example, a micromanipulator may receive micromanipulator control signals from a controller to position a probe at a desired location.

In some examples, the probe assembly may include one or more micromanipulators that may support probes (e.g., electrical probes and/or optical probes). Probes may be supported at a particular angle (e.g., relative to a portion of the sample).

In some examples, the probe assembly may be modified or exchanged between processes. For examples, probe assemblies may include interchangeable probes, which may include electrical probes and/or optical fibers. A probe assembly may be modified or adjusted based on the type of analysis and measurement.

In some examples, an electrical probe may include a wire, such as a metal wire. A probe may have a tapered profile, and may include a tapered wire. In some example, a probe may include a metal, such as a transition metal, such as gold, silver, iridium, nickel, platinum, or tungsten. A probe may include an alloy, such as a platinum alloy such as a platinum-iridium alloy. In some examples, a probe may include a metal having a gold or silver surface coating to reduce corrosion.

In some examples, one or more optical probes may be used, for example, for optical communication with samples including optical components such as waveguides, gratings, waveguide gratings, mirrors, lenses, light emissive elements, and the like.

In some examples, an optical probe may include an optical fiber. An optical probe may include a glass, such as a silicate glass, such as silica. A fiber may have a probe end coupled to the sample, and a controller end coupled to a probe controller within (or otherwise in communication with) the controller of the apparatus. The probe end of a probe fiber may have one or more of the following features: a polished end, a tapered end (e.g., a frustoconical profile having a flat end with a diameter less than that of the bulk fiber), a portion with cladding removed, or an emissive portion. The controller end of a probe fiber may be coupled to an optical source (e.g., a laser, LED, or the like), and/or an optical detector. The fiber may include any suitable fiber core material transmissive to light directed into the sample or received from the sample. In this context, the term light may refer to IR (infrared, e.g., near-IR), visible, or UV light.

An example apparatus may allow tilt and inspection of a sample under an imaging device (e.g., SEM or optical/near-IR microscope) while probes are in contact with the sample. In some examples, an optical probe (e.g., an optical fiber) may be aligned with an optical component (e.g., a waveguide). This may enable characterization of light loss through an optical configuration (e.g., through a waveguide or optical coupling).

In some examples, at least one probe may be used to provide an input signal (e.g., an electrical signal and/or optical signal) to a sample, and at least one probe may be used to receive an output signal from the sample. In some examples, a probe parameter (e.g., electrical resistance, optical transmission, or the like) may be determined between two probe connections to the sample. In some examples, a probe parameter may be determined as an input signal is provided to the sample using one or more different probes (or, in some examples, one or more of the same probes).

The probe assembly may include one or more micromanipulators (e.g., one or more micromanipulators for at least one of x, y, and/or z axes, where these axes may rotate with the sample and/or sample holder). Example apparatus may be configured to move (e.g., tilt, rotate, and/or translate) a sample while the sample is in contact with one or more probes. The probes may be supported by micromanipulators. In some examples, each probe may have an associated micromanipulator.

In some examples, the probes may be in communication with an analytical instrument that may determine one or more probe parameters relating to the sample. For example, electrical probes may be connected to a resistance meter, a capacitance meter, a time-domain reflectometer, a signal analyzer (e.g., a spectral analyzer providing signal intensity data versus frequency), an impedance analyzer (e.g., providing impedance data as a function of frequency), a dielectric spectrometer (e.g., providing permittivity and/or dielectric loss as a function of frequency), TDR (time-domain reflectometer) or other analytical instrument. Optical probes may be connected to a spectrometer (e.g., for IR, visible, and/or UV light, which may include a dispersive element and/or FFT (fast Fourier transform) analysis of transient signals, optical detector (e.g., responsive to an optical intensity), or other sensor or analyzer. For example, an apparatus may allow TDR fault isolation using a TDR in communication with the probes, allowing in-situ fault isolation during layer by layer deposition, ablation, or other process, for example, using DBFIB (e.g., using Ga or Xe ions).

Examples include approaches to failure analysis, including fault isolation and root cause determination. Example methods and apparatus enable identification of the cause of a problem within a sample (e.g., root cause identification). In some examples, failing electrical connections (such as failing traces in a sample, such as a sample including a circuit board) may be determined, in some cases with minimal damage to the sample. An example sample holder may include attached micromanipulators for in-situ probing during application of a process to a sample. In some examples, the process may be additive (e.g., deposition) or subtractive (e.g., ablation or etching). In some examples, a process may include application of SEM (scanning electron microscopy), FIB (focused ion beam), DBFIB (dual beam focused ion beam), SIMS (secondary ion mass spectrometry), electron spectroscopy, x-ray photoelectron spectroscopy (XPS), or other process, for example, a process including other applications of particle (e.g., atoms, electrons, ions) or electromagnetic radiation (e.g., laser radiation).

In some examples, an apparatus may be used with a TDR (time domain reflectometer) for in-situ fault isolation under irradiation by a DBFIB while layer by layer localized removal is carried out with the ion beam (e.g., a gallium or xenon ion beam).

In some examples, EBIC and/or EBAC analysis may be performed on a sample with probes in contact with the sample (e.g., on a sample trace, pin, lead, other conductor, component housing, optical component, or cross section of the sample), facilitating fault isolation. Probes may be placed at different locations within the sample. In some examples, data may be collected for multiple combinations of first and second probe locations, which may be used for diagnostic purposes.

In some example, the sample may include a wafer, such as a silicon wafer (e.g., a wafer having a diameter between 0.5 inches and 4 inches, or in some examples a wafer having a diameter of up to 2 inches.

In some examples, the apparatus may allow low energy electron (LEE) based analysis and/or modification of a sample, for example, to monitor the sample while exposing the sample to LEE. One or more electronic and/or optical parameters may be monitored. In some example, the sample may include one or more LEDs (such as a micro-LED) and/or one or more lasers (e.g., one or more VCSELs). A sample holder may be configured to perform one or more of the following: adjust the temperature of a sample (e.g., using a resistive heater), rotate the sample holder to a process orientation before initiation of a process, rotate the holder back to a starting position after completion of the process, or other temperature adjustment (e.g., heating or cooling) and/or sample rotation. In some examples the sample holder may allow the temperature of the sample to be raised or lowered. For example, an electrical heater and a temperature sensor may be located on the sample holder, and a controller may be used to provide a heater signal to the electrical heater based on a received temperature sensor signal and a received target temperature input (e.g., a temperature input by a user, or a value from a lookup table or other stored value associated with a selected process).

In some examples, a sample may include an electronic and/or optical device, and may include a miniature device and/or component where the sample portion of interest may have a sub-micron or nanometer scale dimension. In some examples, the sample portion of interest may be difficult to characterize using optical light microscopy alone.

In some examples, a sub-micron scale sample portions of interest may be characterized by scanning electron microscopy integrated with an ion beam process. An ion beam process may include a focused ion beam (FIB) process, such as a dual beam process such as a dual beam focused ion beam (DBFIB) processes.

In some examples, a waveguide inspection may include contacting optical probes (e.g., optical fibers) on a waveguide (e.g., a waveguide grating) for inspection and analysis. In some examples, a cross-section of an optical device may be formed to allow contact with different portions of a waveguide.

In some examples, an apparatus may include support portions, a frame (such as a base) configured to maintain the support portions in a spaced-apart configuration, a sample holder configured to receive a sample, and a probe assembly including micromanipulators configured to position one or more probes in contact with the sample. The sample holder may rotate between the support portions, and the probe assembly may rotate with the sample holder so that the one or more probes may maintain contact with a sample in the sample holder as the sample holder is rotated, for example, to expose a portion of the sample for processing.

In some examples, an apparatus may include a multi-angle sample holder with an integrated micromanipulator configured to locate one or more probes in contact with (or otherwise proximate) the sample, while the sample may be translated and/or reoriented to allow processing of a sample portion. In some examples, micromanipulators and probes may rotate with the sample as the sample holder is rotated so that a relative position of a probe relative to the sample may be unchanged as the sample holder is rotated and/or translated.

In some examples, an apparatus allows electrical or optical probes to contact a sample (such as a circuit or device). The probes and sample may then be rotated together to expose any desired part of the circuit for inspection or modification. The sample may include an integrated circuit, electrooptical device such as a laser, other semiconductor device, or other electronic circuit or assembly. In some examples, an apparatus may be configured to allow the sample to be held and rotated between two portions. Micromanipulators, adjustable along up to 3 axes, may be used to position the probes with micron-scale accuracy. Contact may be made between electrical probes and electrical connections along the edge of a circuit, and/or with connections within the body of the circuit. Optical probes may make an optical communication with an optical component that may include one or more of a waveguide, grating, lens, window, or light-emitting device. The sample and micromanipulators may be rotatable together so that the probes remain in contact with the sample as the sample is rotated. Rotation of the sample allows modification and/or inspection of desired portions of the front or back of the sample. Probes may include metal probes, such as wire probes, and may include tapered wires such as tapered tungsten wires. An electrical probe may contact an electrical connection within the sample, such as a pin, electrical trace or other connection, device pin, or other electrical component. One or more probes may be adjustable in any direction to make an electrical contact with the sample at one or more contact locations. The electrical properties of a circuit may be monitored using the probes during processing of the circuit or a component thereof. For example, electrical conductivity may be monitored during deposition or ablation of an electrically conducting material. Example processes include electron or ion beam treatments. In some examples, the sample holder may be placed in the chamber of an laboratory instrument, such as the vacuum chamber of FIB-SEM (Focused Ion Beam-Scanning Electron Microscope) dual beam instrument. In some applications, ion milling, conducting material deposition or other suitable process may be used to modify a chip layout. Probe connections may be used determine the corresponding changes in electrical properties as the process takes place, and SEM may be used to visualize the changes. Example sample holders may be designed as accessories to existing laboratory instruments (such as analytical instruments), and may facilitate improved evaluation, layout modification and/or design changes of fabricated circuits, such as integrated circuits used in augmented reality and/or virtual reality applications.

Example Embodiments

Example 1: An apparatus may include a first support portion, a second support portion, a frame configured to maintain the first and second support portions in a spaced-apart configuration, a sample holder configured to receive a sample, and a probe assembly including at least one probe, where the sample holder is configured to rotate between the first and second support portions, the probe assembly includes a micromanipulator arrangement configured to position the at least one probe in contact with the sample when the sample is received in the sample holder, and the probe assembly is configured to rotate with the sample holder to maintain contact with the sample when the sample holder is rotated between the first and second support portions.

Example 2. The apparatus of example 1, where the frame includes a base, and the first and second support portions are attached to the base.

Example 3. The apparatus of any of examples 1 or 2, where the sample holder includes an attachment configured to receive the sample, and the attachment includes at least one of a hole, a clamp, or a screw.

Example 4. The apparatus of any of examples 1-3, where the sample holder is attached to the first support portion by a rotatable attachment.

Example 5. The apparatus of any of examples 1-4, where the sample holder includes: a first sample holder part attached to the first support portion by a first rotatable attachment, and a second sample holder part attached to the second support portion by a second rotatable attachment, where the sample mechanically interconnects the first and second sample holder parts when the sample is received by the sample holder, and at least one of the first and second rotatable attachments includes a motor.

Example 6. The apparatus of any of examples 1-5, where the micromanipulator arrangement includes a micromanipulator configured to move the at least one probe relative to the sample holder.

Example 7. The apparatus of any of examples 1-6, where the micromanipulator arrangement includes a plurality of micromanipulators configured to move the at least one probe along one or more of a plurality of directions relative to the sample holder.

Example 8. The apparatus of any of examples 1-7, where the at least one probe includes an electrical probe.

Example 9. The apparatus of any of examples 1-8, where the at least one probe includes an optical probe.

Example 10. The apparatus of any of examples 1-9, further including a controller configured to determine a probe parameter based on a probe signal obtained from the probe assembly.

Example 11. The apparatus of any of examples 1-10, where the at least one probe includes a pair of electrical probes, and the probe parameter is based on an electrical resistance between the pair of electrical probes.

Example 12. The apparatus of any of examples 1-11, where the at least one probe includes a pair of optical probes, and the probe parameter is based on an optical transmission between the pair of optical probes.

Example 13. The apparatus of any of examples 1-12, where the controller is further configured to control a rotation of the sample holder through a predetermined angle, and initiate application of a process to a portion of the sample.

Example 14. The apparatus of example 13, where the controller is further configured to determine the probe parameter during the application of the process to the portion of the sample, and rotate the sample holder back to a starting position after completion of the process.

Example 15. The apparatus of any of examples 1-14, where the sample holder is configured to adjust a temperature of the sample when the sample is received by the sample holder, and the process includes a deposition or an ablation.

Example 16. An example method may include contacting a plurality of probes to a sample when the sample is located in a sample holder, rotating the sample holder to expose a portion of the sample, the plurality of probes remaining in contact with the sample as the sample holder is rotated, processing the portion of the sample, and measuring a probe parameter during the processing of the portion of the sample, where the probe parameter is based on an electrical impedance or an optical transmissivity between a pair probes of the plurality of probes.

Example 17. The method of example 16, where the pair of probes is a pair of electrical probes, and the probe parameter is an electrical impedance between the pair of electrical probes.

Example 18. The method of any of examples 16 or 17, where the pair of probes is a pair of optical probes, and the probe parameter is an optical transmissivity between the pair of optical probes.

Example 19. The method of any of examples 16-18, where the processing the portion of the sample further includes exposing the portion of the sample to a particle beam or an electromagnetic beam.

Example 20. The method of any of examples 16-19, further including receiving the sample by the sample holder, locating the sample holder in a chamber of an instrument, and evacuating the chamber so that the sample is located within at least a partial vacuum.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed (e.g., probe signal data related to signals provided to and/or received from a sample), transform the data (e.g., to determine a probe parameter from probe signal data), output a result of the transformation to perform a function (such as to perform additional processing or output a command to stop a process), use the result of the transformation to perform a function, and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device. In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference may be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a first support portion;
   a second support portion;
   a frame configured to maintain the first and second support portions in a spaced-apart configuration;
   a sample holder configured to receive a sample; and
   a probe assembly comprising at least one probe,
   wherein:
      the sample holder is configured to rotate between the first and second support portions;
      the probe assembly comprises a micromanipulator arrangement configured to position the at least one probe in contact with the sample when the sample is received in the sample holder; and
      the probe assembly is configured to rotate with the sample holder to maintain contact with the sample when the sample holder is rotated between the first and second support portions.

2. The apparatus of claim 1, wherein:
   the frame comprises a base; and
   the first and second support portions are attached to the base.

3. The apparatus of claim 1, wherein:
   the sample holder comprises an attachment configured to receive the sample; and
   the attachment comprises at least one of a hole, a clamp, or a screw.

4. The apparatus of claim 1, wherein the sample holder is attached to the first support portion by a rotatable attachment.

5. The apparatus of claim 1, wherein the sample holder comprises:
   a first sample holder part attached to the first support portion by a first rotatable attachment; and
   a second sample holder part attached to the second support portion by a second rotatable attachment,
   wherein:
      the sample mechanically interconnects the first and second sample holder parts when the sample is received by the sample holder; and
      at least one of the first and second rotatable attachments comprises a motor.

6. The apparatus of claim 1, wherein the micromanipulator arrangement comprises a micromanipulator configured to move the at least one probe relative to the sample holder.

7. The apparatus of claim 1, wherein the micromanipulator arrangement comprises a plurality of micromanipulators configured to move the at least one probe along one or more of a plurality of directions relative to the sample holder.

8. The apparatus of claim 1, wherein the at least one probe comprises an electrical probe.

9. The apparatus of claim 1, wherein the at least one probe comprises an optical probe.

10. The apparatus of claim 1, further comprising a controller configured to determine a probe parameter based on a probe signal obtained from the probe assembly.

11. The apparatus of claim 10, wherein the at least one probe comprises a pair of electrical probes; and
the probe parameter is based on an electrical resistance between the pair of electrical probes.

12. The apparatus of claim 10, wherein:
the at least one probe comprises a pair of optical probes; and
the probe parameter is based on an optical transmission between the pair of optical probes.

13. The apparatus of claim 10, wherein the controller is further configured to:
control a rotation of the sample holder through a predetermined angle; and
initiate application of a process to a portion of the sample.

14. The apparatus of claim 13, wherein the controller is further configured to:
determine the probe parameter during the application of the process to the portion of the sample; and
rotate the sample holder back to a starting position after completion of the process.

15. The apparatus of claim 13, wherein:
the sample holder is configured to adjust a temperature of the sample when the sample is received by the sample holder; and
the process comprises a deposition or an ablation.

16. A method, comprising:
contacting a plurality of probes to a sample when the sample is located in a sample holder;
rotating the sample holder to expose a portion of the sample, the plurality of probes remaining in contact with the sample as the sample holder is rotated;
processing the portion of the sample; and
measuring a probe parameter during the processing of the portion of the sample, wherein the probe parameter is based on an electrical impedance or an optical transmissivity between a pair probes of the plurality of probes.

17. The method of claim 16, wherein:
the pair of probes is a pair of electrical probes; and
the probe parameter is an electrical impedance between the pair of electrical probes.

18. The method of claim 16, wherein:
the pair of probes is a pair of optical probes; and
the probe parameter is an optical transmissivity between the pair of optical probes.

19. The method of claim 16, wherein the processing the portion of the sample further comprises exposing the portion of the sample to a particle beam or an electromagnetic beam.

20. The method of claim 19, further comprising:
receiving the sample by the sample holder;
locating the sample holder in a chamber of an instrument; and
evacuating the chamber so that the sample is located within at least a partial vacuum.

* * * * *